US005896269A

United States Patent [19]
Autry

[11] Patent Number: 5,896,269
[45] Date of Patent: Apr. 20, 1999

[54] POSITIVE PRESSURE HEAT SINK CONDUIT

[75] Inventor: Sidney David Autry, Dakota Dunes, S. Dak.

[73] Assignee: Gateway 2000, Inc., North Sioux City, S. Dak.

[21] Appl. No.: 08/757,323

[22] Filed: Nov. 27, 1996

[51] Int. Cl.$^6$ .................................................. H05K 7/20
[52] U.S. Cl. .................. 361/704; 165/80.3; 165/185; 174/16.3; 257/706; 257/712; 361/690
[58] Field of Search ................... 165/80.2, 86.3, 165/185; 174/16.3; 257/707, 712–713, 718–719, 722, 726–727; 361/688–690, 704, 707–708, 717–718, 722; 336/61; 267/30

[56] References Cited

U.S. PATENT DOCUMENTS

| | | | |
|---|---|---|---|
| 2,063,216 | 12/1936 | Zaparka | 267/30 |
| 3,883,834 | 5/1975 | Osteen | 336/61 |
| 4,689,720 | 8/1987 | Daszkowski | 361/704 |
| 4,720,770 | 1/1988 | Jameson | 361/387 |
| 5,270,902 | 12/1993 | Bellar et al. | 361/718 |
| 5,313,099 | 5/1994 | Tata et al. | 257/717 |
| 5,321,582 | 6/1994 | Casperson | 361/713 |
| 5,353,863 | 10/1994 | Yu | 165/80.3 |
| 5,363,552 | 11/1994 | Coniff | 29/840 |
| 5,397,919 | 3/1995 | Tata et al. | 257/717 |
| 5,402,313 | 3/1995 | Casperson et al. | 361/710 |
| 5,430,611 | 7/1995 | Patel et al. | 361/705 |
| 5,436,798 | 7/1995 | Wieland | 361/710 |
| 5,650,914 | 7/1997 | Distefano et al. | 361/704 |

FOREIGN PATENT DOCUMENTS 2059569 4/1981 United Kingdom ............... 361/689

*Primary Examiner*—Gregory Thompson
*Attorney, Agent, or Firm*—Schwegman, Lundberg, Woessner & Kluth, P.A.; Anthony Claiborne

[57] ABSTRACT

A heat sink conduit, for use in cooling electronic devices, made of an elongate strip of thermally conductive material that is repeatedly folded onto itself in an accordion, sinusoidal or serpentine like manner. The elongate strip is compressed between a heat producing component and a heat sink. This compression causes each of the two end segments of the elongate strip to be in positive contact with either the heat producing component or the heat sink. This positive contact allows the heat to be conducted away from the heat producing component to the heat sink and the large surface area of the conduit provides for the transfer of heat through convection and radiation, thereby cooling the heat producing component and the electronic device.

4 Claims, 3 Drawing Sheets

POSITIVE PRESSURE HEAT SINK CONDUIT

FIELD OF THE INVENTION

The present invention relates to devices for removing thermal energy from heat producing electronic components, and more specifically to a heat sink conduit for dissipating heat from an electronic component to a heat sink.

BACKGROUND OF THE INVENTION

Electronic computer components produce waste heat which, if not properly dissipated, can become excessive and cause damage to the components. Therefore, controlling and dissipating the heat is important to prevent damage to the computer. As computer technology advances, removal of waste heat becomes increasingly important. Many computer components of today are smaller, faster and more powerful and produce more heat per unit volume than past components. It is known to use heat sinks to dissipate heat generated by the electronic components to prevent over heating. Usually, the heat producing component is attached to a heat sink with a type of radial arm. In order to remove heat efficiently, there should be a well defined thermally conductive path between the heat producing component and the heat sink.

There are many techniques used to remove thermal energy from electronic devices. One such technique is described in U.S. Pat. No. 5,207,902 to Bellar et al. This patent discloses the use of a radial arm between two thermally conductive membranes. One membrane is attached to an integrated circuit and the other membrane to the heat sink. This allows the heat to transfer from the integrated circuit through the radial arm to the heat sink.

Another technique is described in U.S. Pat. No. 5,397,919 to Tata et al. which describes a heat sink assembly for use with a microprocessor chip. The assembly has a finned heat sink with a threaded base that screws into a threaded bore of an adaptor, into which the microprocessor chip is placed. Thermal contact is achieved by screwing down the heat sink until it contacts the microprocessor chip.

This contact allows the thermal energy to be transferred from the microprocessor to the heat sink.

Yet another technique is described in U.S. Pat. No. 5,353,863 to Yu. A device for cooling a Pentium chip is disclosed having a flanged heat sink that clamps to the chip with clamping plates. The plates conduct heat from the Pentium chip toward the top of the heat sink and a fan is mounted to the heat sink to dissipate the heat out of the computer chassis.

In U.S. Pat. No. 5,402,313 to Casperson et al., another technique is disclosed that uses a canted coil spring to apply direct pressure to the integrated circuit chips. The assembly consists of a heat sink housing, a thermally conductive film that the integrated circuit chips are pressed against and a housing or abutment to counteract the force of the spring. The spring force is applied to the chip to produce contact between the integrated circuit chip and the heat sink to allow for thermal dissipation.

There are many other known devices and techniques to dissipate heat from electronic components. There are limits to the effectiveness of the known devices. Many of these devices are expensive or complicated to produce. Many cannot adequately dissipate heat from the new generation of microprocessors. Since the components are smaller, there is now less space available for a heat sink in today's electronic equipment. The industry needs a heat sink conduit that occupies less space. The problem is magnified as computers and microprocessors get smaller, faster and more powerful due to higher circuit density producing even more heat in the smaller confined space. A heat sink conduit is needed that can be used in small spaces with smaller integrated circuit chips.

There is also a need for a heat sink conduit of a simpler design. Many of the known devices are mechanically complex, not easy to install, and may be difficult to remove when the device or component needs repair. A heat sink conduit is needed that has fewer parts, is easier to install, and easier to remove when service of the device or component is required. Also, a cheaper heat sink conduit is needed. Many of the known devices are expensive to manufacture and install.

There is also a need for a heat sink conduit that conducts heat efficiently from the heat generating component to the heat sink. As electronic components get smaller and more powerful, they generate more heat in a smaller, more confined space. One example is the Pentium processor, which generates more heat in a smaller area than its predecessors. Many previous devices are not adequate to dissipate heat from the new processors. Therefore, a heat sink conduit is needed that is more efficient at dissipating waste heat to the heat sink.

SUMMARY OF THE INVENTION

The present invention teaches a positive pressure heat sink conduit for dissipating heat from a heat producing electronic component to a heat sink. The conduit provides a thermally conductive path from the component to the heat sink and has a large surface area for dissipating heat via convection and radiation.

In one embodiment, the invention comprises an elongate strip that has two ends and two end segments. The strip is repeatedly folded over onto itself in a sinusoidal, serpentine or accordion like manner. After folding, the two end segments are in parallel with each other. The strip is placed under compression with one end segment of the strip in contact with the heat producing electronic component and the opposite end segment in contact with the heat sink. Under compression, the folded strip acts similar to a spring, achieving a firm, positive contact with both the heat producing component and the convective heat sink. The positive contact provided by the spring force insures that the folded strip conducts heat to the heat sink. The spring force also keeps the conduit from slipping and helps to dampen vibrations, further protecting the components. The shape of the folded strip provides a large surface area with space between the spring elements to radiate heat from its surface and permits air flow over the spring between the heat sink and component.

In other embodiments, the folded strip includes an additional means for increasing its surface area. The increased surface area provides for a more effective transfer of heat via convection and radiation. In one such embodiment, thermally conductive fins are included on the surface of the folded strip to increase its surface area to allow more heat to dissipate from the folded strip's surface.

According to one aspect of the present invention, the positive pressure conduit provides a thermally conductive path between the heat producing component and the heat sink to transfer heat. According to another aspect of the present invention, the conduit has an increased surface area that allows further dissipation of heat through convection and radiation to the surrounding air flowing over the conduit.

According to yet another aspect of the present invention, the conduit is small but efficiently transfers and dissipates heat so that smaller electronic components such as integrated circuits producing more heat can be cooled effectively. According to yet another aspect of the present invention, the conduit is easy to install and the spring-like positive pressure keeps the conduit from slipping once the conduit is installed. According to yet another aspect of the invention, the spring-like positive pressure applied by the heat sink conduit causes the conduit to dampen vibrations further protecting the components. Various other objects and advantages of the present invention will become apparent from the following detailed description and accompanying drawings.

BRIEF DESCRIPTION OF THE DRAWINGS

In the accompanying drawings in which several of the preferred embodiments of the invention are illustrated.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
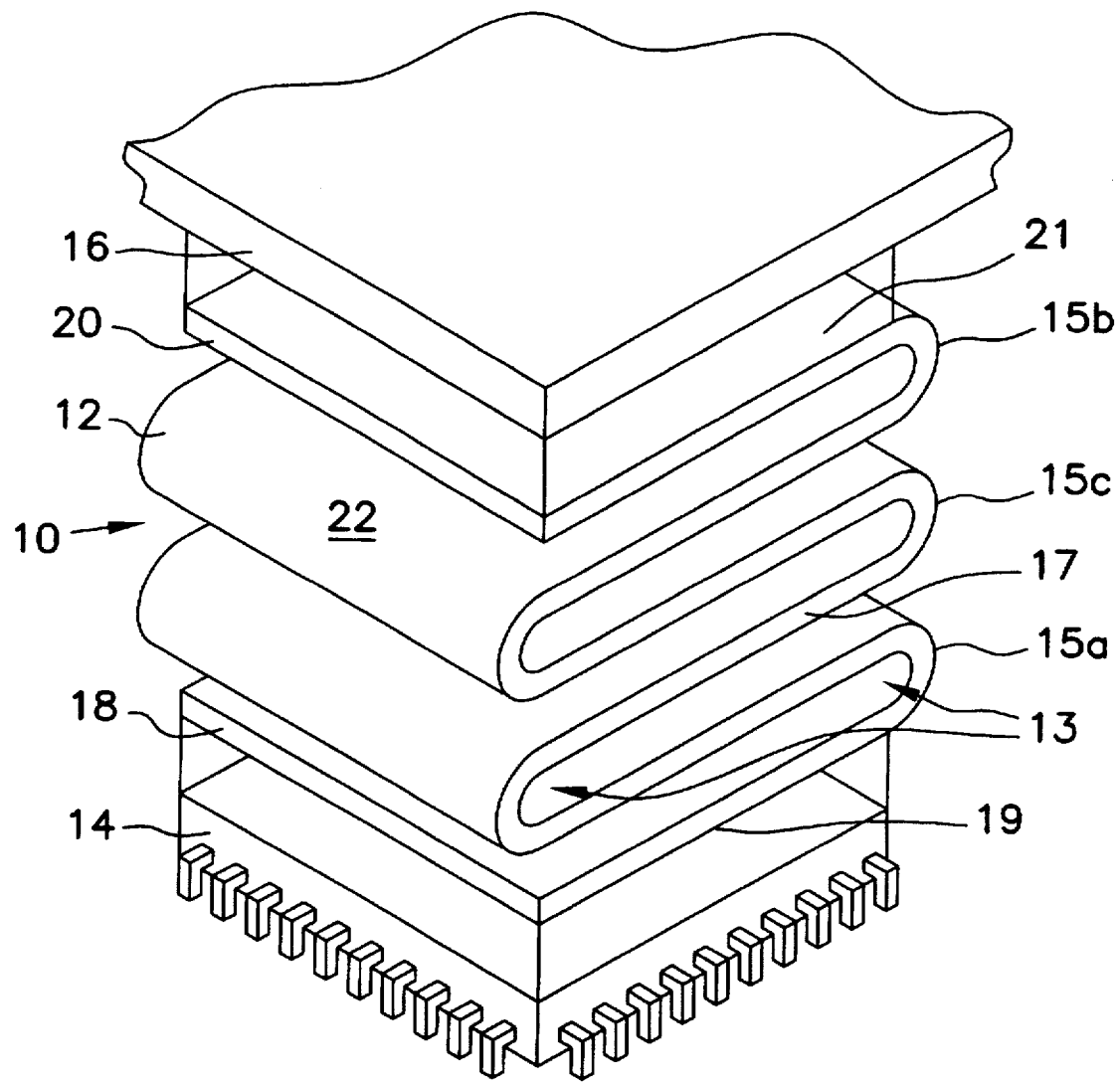
FIG. 1 is an exploded view in perspective of a positive pressure heat sink conduit constructed according to one embodiment of the present invention having a sinusoidal or serpentine form.

Referring now to the drawings, FIG. 1 illustrates one embodiment of a heat sink conduit 10 constructed in accordance with the present invention. The heat sink conduit 10 is made of an elongate strip 12 of material of a desired length and width. The length and width of the strip 12 is varied depending on the desired size, shape and heat dissipation properties of the heat sink conduit 10. The strip 12 has a surface 22 that varies in area with the selected length, width, and thickness of the strip. The strip 12 has a first end 18 and second end 20. The strip 12 is preferably made of suitable material that is both thermally conductive and capable of producing a spring-like force when formed and properly treated.

As shown in FIG. 1 in exploded view, the elongate strip 12 is repeatedly folded onto itself in a sinusoidal or serpentine manner forming the conduit 10. Each end 18,20 has a connected end segment 19,21. The end segments 19,21 can be varied in length and width according to the size of their respective heat producing components. After folding, the first end segment 19 is generally parallel to the second end segment 21 as illustrated in FIG. 1. As will be evident to those skilled in the art, the orientation of end segments 19,21 is not intended to be limited by the scope of the invention. The end segment orientations will simply vary relative to one another depending upon the orientation of the surface to which they each will be attached, such as a heat producing electronic element, a heat sink, a computer cabinet, or some other surface.

The conduit 10 has at least two bends, a first bend 15a spaced from first end 18 defining first end segment 19 therebetween and a second bend 15b spaced from a second end 20 defining end segment 21 therebetween. Conduit 10 may include multiple additional intermediate bends 15c with connecting intermediate linear segments 17. The number of bends 15c and segments 17 may depend on the desired heat transfer characteristics, size and shape of the conduit and the amount of space available for the conduit. The length of the segments 17, 19, 21 and the sharpness or tightness of the bends 15a, b, c may also be varied as will be evident to those in the art. A space 13 is defined between each adjacent pair of parallel segments 17, 19, 21.

Figure 2:
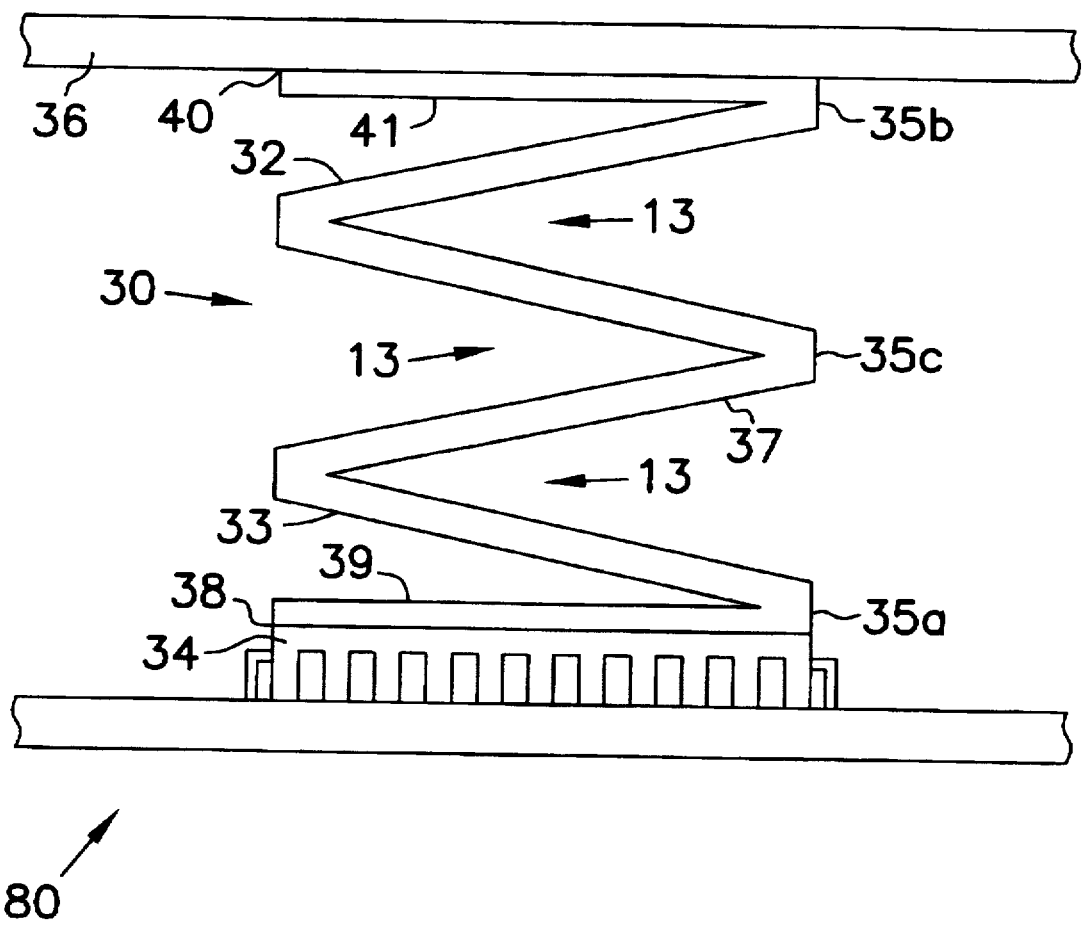
FIG. 2 is a side view of an alternative embodiment of a positive pressure heat sink conduit having an accordion form.

In one embodiment, the conduit 10 is placed under compression between a heat producing component 14 and a heat sink 16 in an electronic device 80 (as shown in FIG. 2 for another embodiment of a heat sink conduit). The conduit 10 is compressed as installed with first end segment 19 in positive contact with the heat producing component 14 and second end segment 21 in positive contact with the heat sink 16. The conduit 10 performs several functions. The conduit 10 provides a thermally conductive path between the heat producing component 14 and the heat sink 16 by conducting heat through the strip 12 to the heat sink 16. The conduit 10 also transfers heat through convection and radiation from its outer surface 22 to the surrounding air flowing around the spaces 13 of the conduit 10. Increasing the amplitude of the folds increases the surface 22 area available for heat transfer. Further, the spring force the conduit exerts against the heat producing component 14 and the heat sink keeps the conduit from slipping. Thus, no further components or devices are needed for installing the heat sink conduit 10. In another preferred embodiment, the end segment 19 is secured to its respective surface by a thermal epoxy or received in a positive fit depression formed in the surface against which the end segment rests. The heat sink conduit 10, acting as a spring, also dampens vibration protecting the heat producing component 14.

In addition to showing a heat sink conduit as installed, FIG. 2 shows an alternative embodiment of a conduit as well. A heat sink conduit 30 is made of an elongate strip 32 of material of a certain length and width. The length and width of the strip 32 is varied depending on the desired size and shape of the heat sink conduit 30. The strip 32 has an outer surface 33 that varies in area with selected length, width, and thickness of the strip. The strip 32 has a first end 38 and second end 40. The strip 32 is preferably made of suitable material that is both thermally conductive and capable of producing a spring-like force when formed and properly treated.

The elongate strip 32 is repeatedly folded onto itself in an accordion like manner forming the conduit 30 as shown in FIG. 2. Each end 38,40 of the strip 32 has a connected end segment 39,41. The end segments 39,41 can be varied in length, but both the first end segment 39 and second end segment 41 are preferably the same length. After folding, the first end segment 39 is generally parallel to the second end segment 41. The conduit 30 has at least two sharp bends, a first sharp bend 35a spaced from first end 38 defining a first end segment 39 therebetween and a second sharp bend 35b spaced from second end 40 defining a second end segment 41 therebetween. Conduit 30 may include multiple additional intermediate sharp bends 35c with connecting intermediate linear segments 37. The number of bends 35c and segments 37 may depend on the desired heat transfer characteristics, size and shape of the conduit and the amount of space available for the conduit. The length of the segments 37,39,41 and the sharpness or tightness of the bends 35a, b, c may also be varied as will be evident to those in the art. A space 13 is defined between each adjacent pair of segments 37,39,41.

The strip 32 is then compressed and installed with the first end segment 39 in positive contact with the heat producing component 34 and the second end segment 41 in positive contact with the heat sink 36. This more angular manner of folding the strip 32 still allows for the strip 32 to produce the spring like tension necessary to maintain the positive contact between the end segments 39,41 of the strip 32 and the heat producing component 34 and the heat sink 36 to allow conduction to occur.

Figure 3:
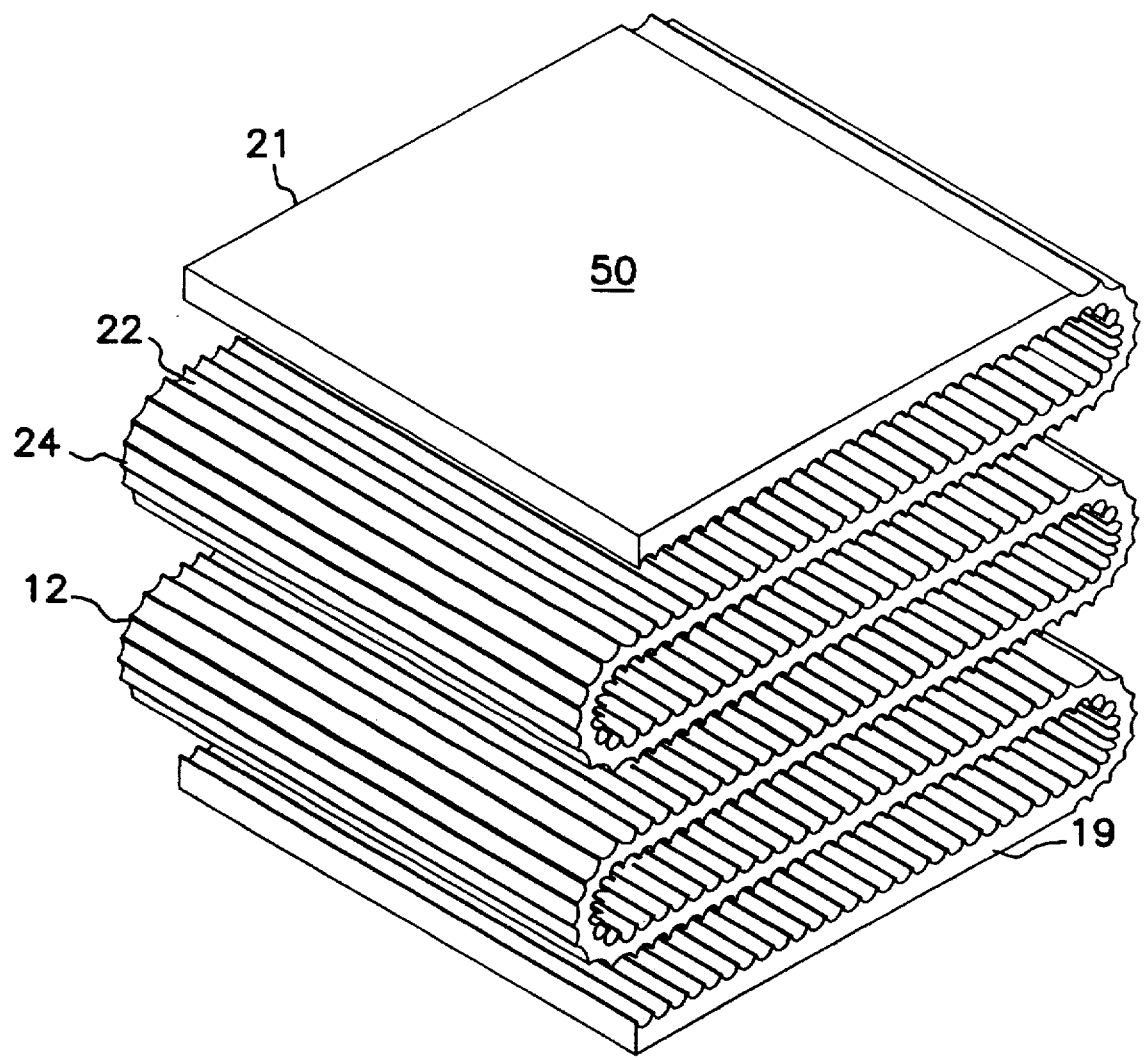
FIG. 3 is a perspective view of an alternative embodiment of a positive pressure heat sink conduit having fins included on the conduit's surface.

Alternatively, as shown in the embodiment of FIG. 3, instead of using a smooth elongate strip, different means may be utilized to provide the outer surfaces 22 or 33 with an increased surface area. These means, though illustrated herein in conjunction with the embodiment of conduit 10, may be used with either of the embodiments explained above or other embodiments which may be apparent to one skilled in the art. Increasing the area of outer surface 22 improves thermal radiation from the strip 12 to the surrounding air around the conduit 10. In FIG. 3, fins 24 extend perpendicularly from the surface 22 of the strip 12 achieving an increased area of outer surface 22. To provide excellent thermal conductive characteristics, it is preferred that the two end segments 19 and 21 include a generally flat outer mating surface 50 for mating with their adjacent electronic component and heat sink.

Other surface textures or configurations such as a honeycomb structure extending from the strip may be utilized to add surface area to conduit 10. The strip 12 may be formed from a material other than a flat strip such as a multiple honeycomb structure to increase the surface area of conduit 10 resulting in increased exposure to surrounding air around the conduit 10. A multiple honeycomb structure may also be included on the surface 22 of the conduit similar to fins 24 described above.

One particular application for the present invention is within a computer. The heat producing component 14 may be a central processing unit (CPU) or an integrated circuit (IC) and the heat sink 16 may be a computer case or a heat sink therein. Therefore, the heat sink conduit 10 provides a thermally conductive path to transfer waste heat from the CPU or IC through the conduit 10 to the computer case and further transfer heat via convection and radiation to the surrounding air within the computer case flowing over the surface 22 of the conduit 10. There are many types of heat sinks that may be used with the present invention. Many heat sinks attach adjacent a printed circuit board providing for the placement of the heat sink conduits therebetween. Others may have one heat sink within the computer that conducts heat to another heat sink external to the computer. In such an embodiment, one heat sink conduit is disposed between the heat sinks and another between the heat sink and the heat producing component. This adaptability is important because as computers get smaller and more powerful, the only design criteria for the conduit is the space between the heat sink and the heat producing components. The spring conduit also is effective in accommodating design and manufacturing tolerance variations between the heat sink and components.

The present invention is applicable in a wide range of applications to devices having various electronic components that generate waste heat which cannot be adequately dissipated without using a small, efficient heat sink conduit. The present invention provides a simple, low cost, and effective method of transferring heat from a heat producing component to a heat sink and the surrounding air. The invention also provides further benefits such as easy installation. The conduit need only be of a proper size to fit between the heat sink and the heat producing component. The positive pressure applied against the heat sink and the electronic component holds the conduit in place and ensures thermal conductive contact. Thus, it is easy to install a conduit and therefore easy to remove when repair is necessary to the device or a component. Finally, the spring-like positive pressure applied by the heat sink conduit causes the conduit to dampen or absorb vibrations thereby further protecting the components.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A heat sink conduit for an electronic device having a heat sink and at least one heat producing component, said heat sink conduit formed from an elongate strip of thermally conductive material folded in an accordion like manner, the heat sink conduit comprising:

one or more heat conductive fins extending from said elongate strip;

a first end;

a second end opposite said first end;

a first bend spaced from said first end wherein a first end segment is defined therebetween;

a second bend spaced from said second end wherein a second end segment is defined therebetween, said second end segment being generally parallel to said first end segment; and an intermediate portion having at least one intermediate linear segment disposed between and spaced from said first and second end segments, said intermediate portion being coupled with said first bend and said second bend.

2. The heat sink conduit of claim 1 wherein said intermediate portion comprises two or more intermediate linear segments interconnected by one or more intermediate bends.

3. The heat sink conduit of claim 2 wherein said first end segment is adapted to be in thermal contact with the heat producing component(s).

4. The heat sink conduit of claim 3 wherein said second end segment is adapted to be in thermal contact with the heat sink.

* * * * *